United States Patent
Yasuda

(10) Patent No.: US 9,696,541 B2
(45) Date of Patent: Jul. 4, 2017

(54) TWO-DIMENSIONAL OPTICAL DEFLECTOR INCLUDING TWO SOI STRUCTURES AND ITS MANUFACTURING METHOD

(71) Applicant: STANLEY ELECTRIC CO., LTD., Meguro-ku, Tokyo (JP)

(72) Inventor: Yoshiaki Yasuda, Yokohama (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 88 days.

(21) Appl. No.: 14/697,211

(22) Filed: Apr. 27, 2015

(65) Prior Publication Data

US 2015/0338644 A1    Nov. 26, 2015

(30) Foreign Application Priority Data

May 21, 2014    (JP) ................. 2014-105720

(51) Int. Cl.
| | |
|---|---|
| *G02B 26/08* | (2006.01) |
| *B81C 1/00* | (2006.01) |
| *G02B 7/182* | (2006.01) |
| *G02B 26/10* | (2006.01) |

(52) U.S. Cl.
CPC ...... *G02B 26/0858* (2013.01); *B81C 1/00357* (2013.01); *G02B 7/182* (2013.01); *G02B 26/101* (2013.01); *B81C 1/00634* (2013.01)

(58) Field of Classification Search
None
See application file for complete search history.

(56) References Cited

U.S. PATENT DOCUMENTS

| | | | |
|---|---|---|---|
| 2009/0180167 A1* | 7/2009 | Tani ................... | G02B 26/0858 359/198.1 |
| 2009/0185253 A1 | 7/2009 | Tani et al. | |
| 2009/0323151 A1* | 12/2009 | Tani ................... | G02B 26/0858 359/221.2 |
| 2012/0162664 A1 | 6/2012 | Bakke et al. | |
| 2012/0243065 A1 | 9/2012 | Koyama | |
| 2013/0084661 A1 | 4/2013 | Yasuda | |

FOREIGN PATENT DOCUMENTS

JP    2008040240 A    2/2008

OTHER PUBLICATIONS

Extended European Search Report dated Mar. 7, 2016, issued in counterpart European Application No. 15167660.8.

* cited by examiner

*Primary Examiner* — Derek S Chapel
(74) *Attorney, Agent, or Firm* — Holtz, Holtz & Volek PC

(57) ABSTRACT

A two-dimensional optical deflector includes a first SOI structure and a second SOI structure. A height of a monocrystalline silicon support layer of the first SOI structure is smaller than a height of a monocrystalline silicon support layer of the second SOI structure. A mirror includes a monocrystalline silicon active layer of the first SOI structure. An inner frame, an inner piezoelectric actuator and an outer frame include a monocrystalline silicon active layer of the first SOI structure and the monocrystalline silicon active layer of the second SOI structure. An outer piezoelectric actuator includes the monocrystalline silicon active layer of the first SOI structure.

14 Claims, 16 Drawing Sheets

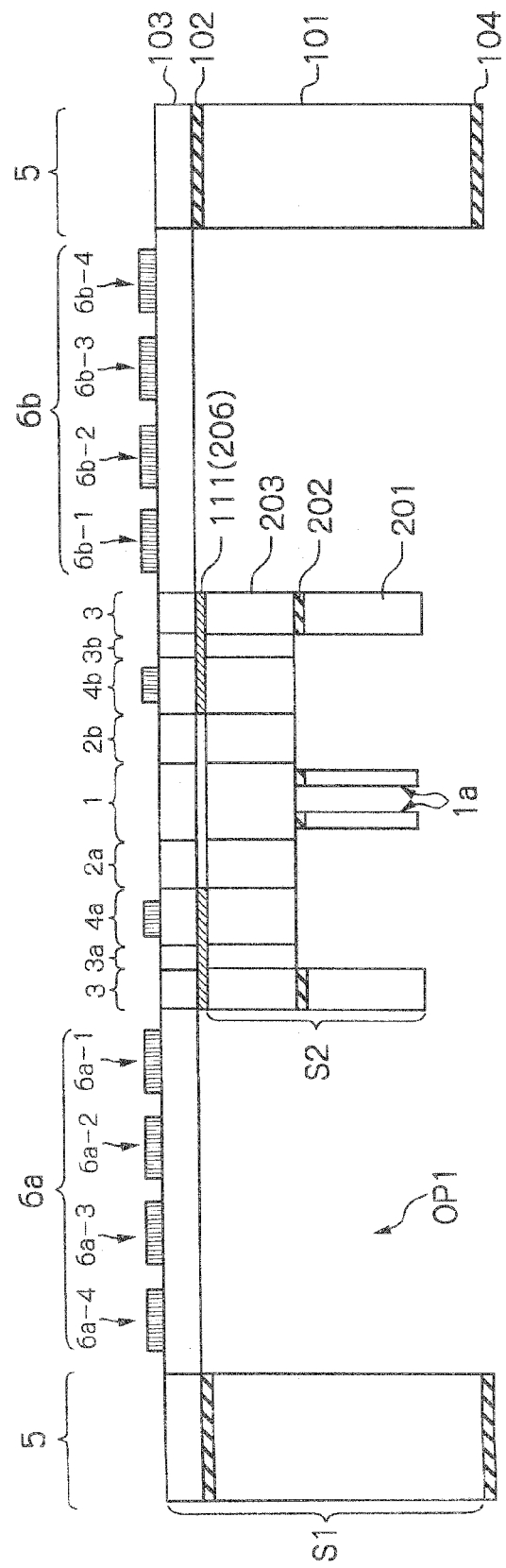

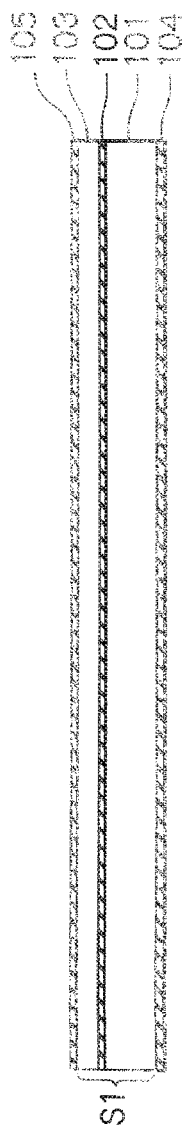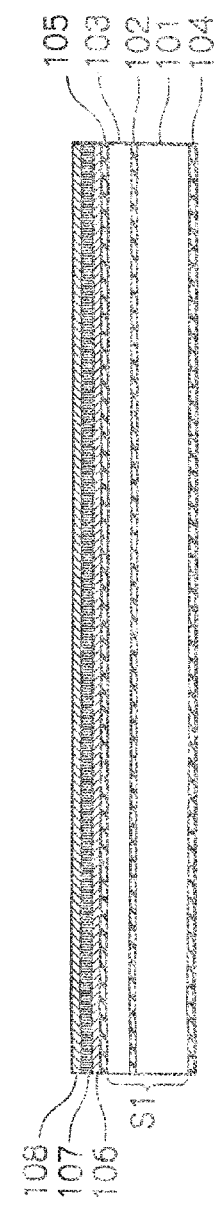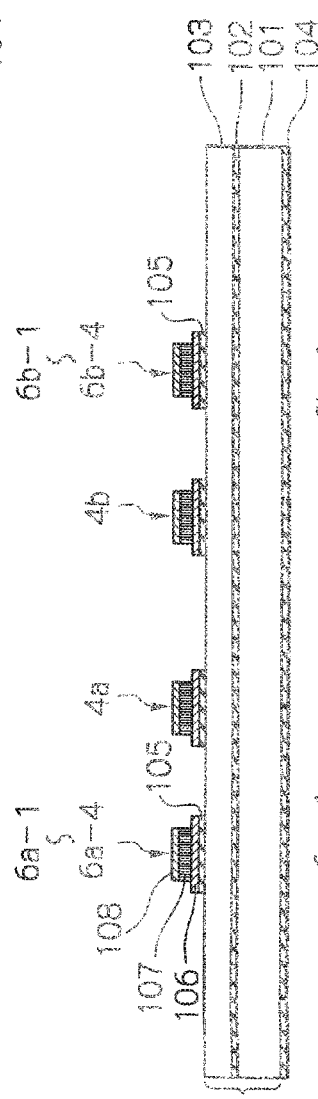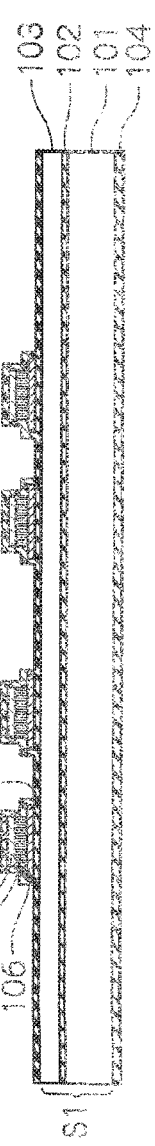

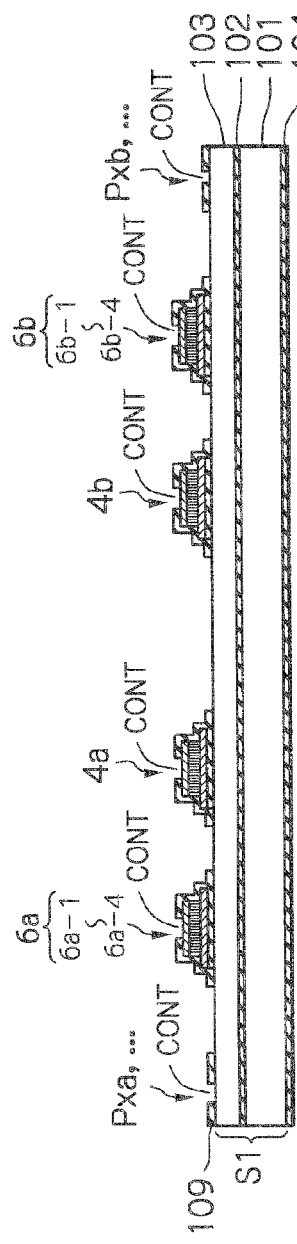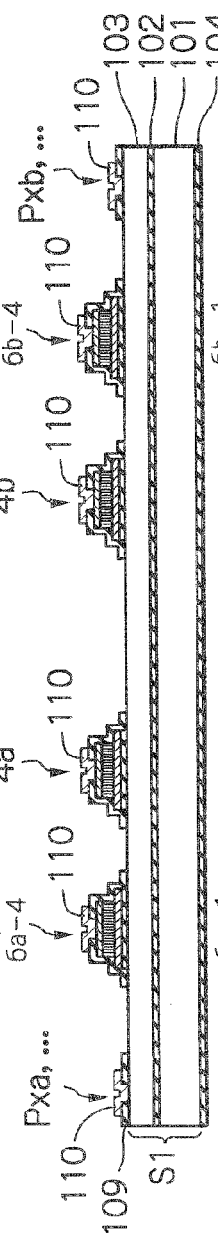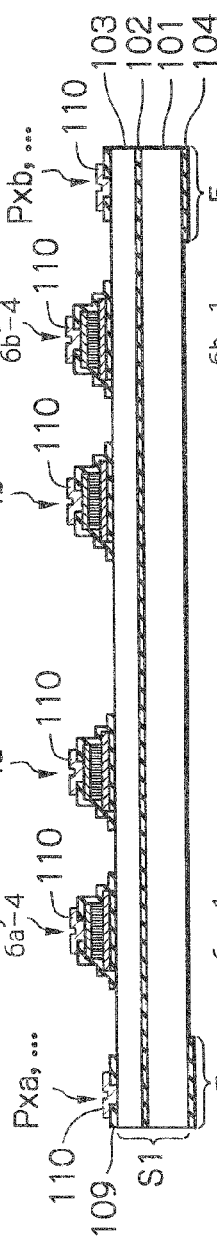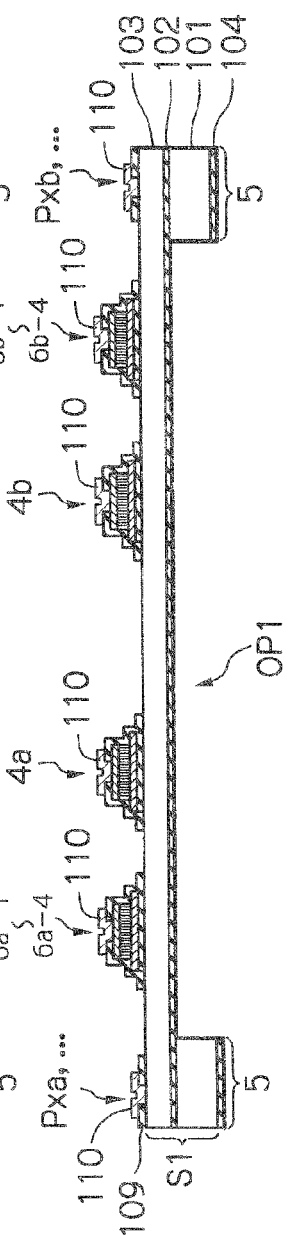

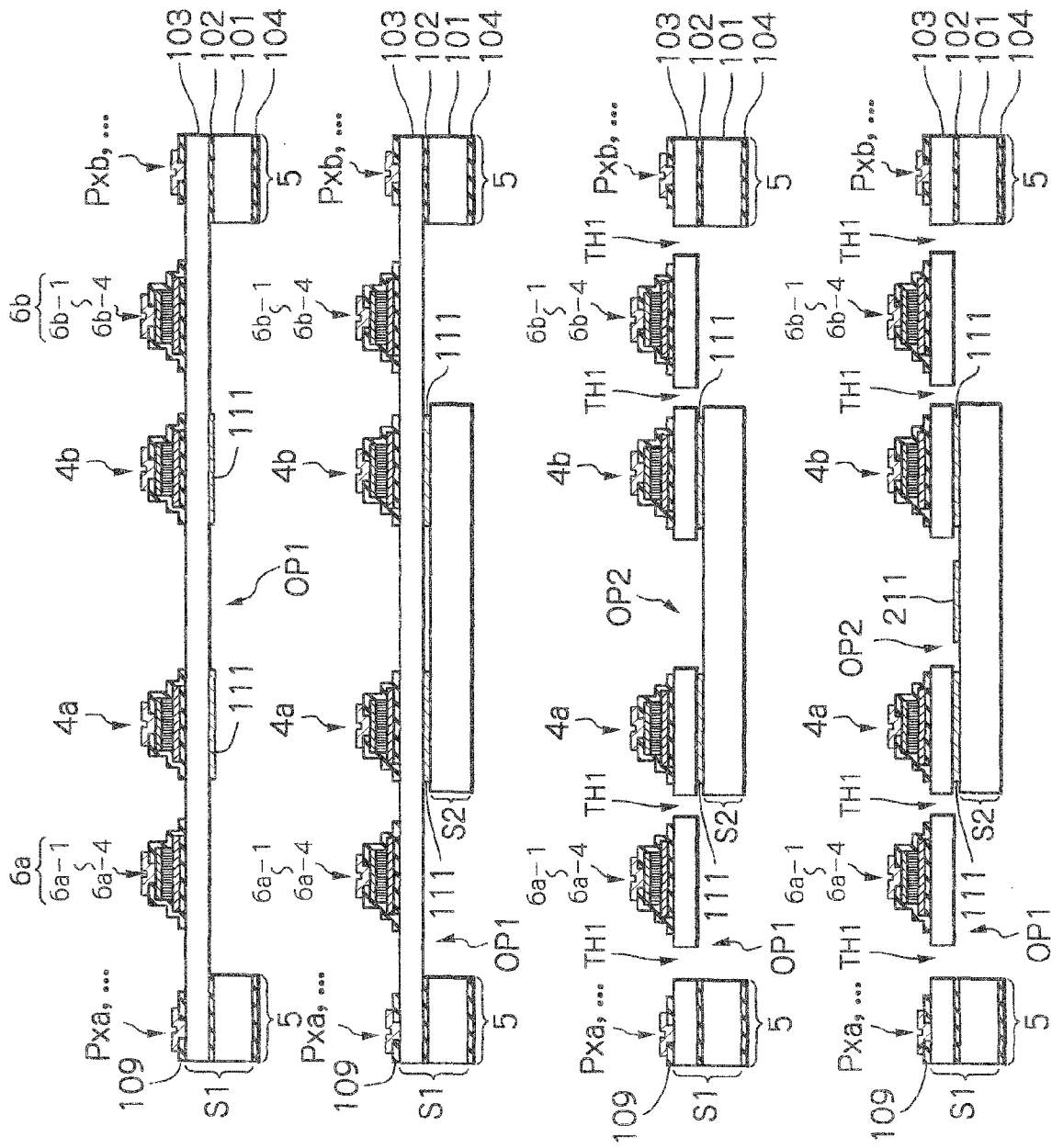

Fig. 9
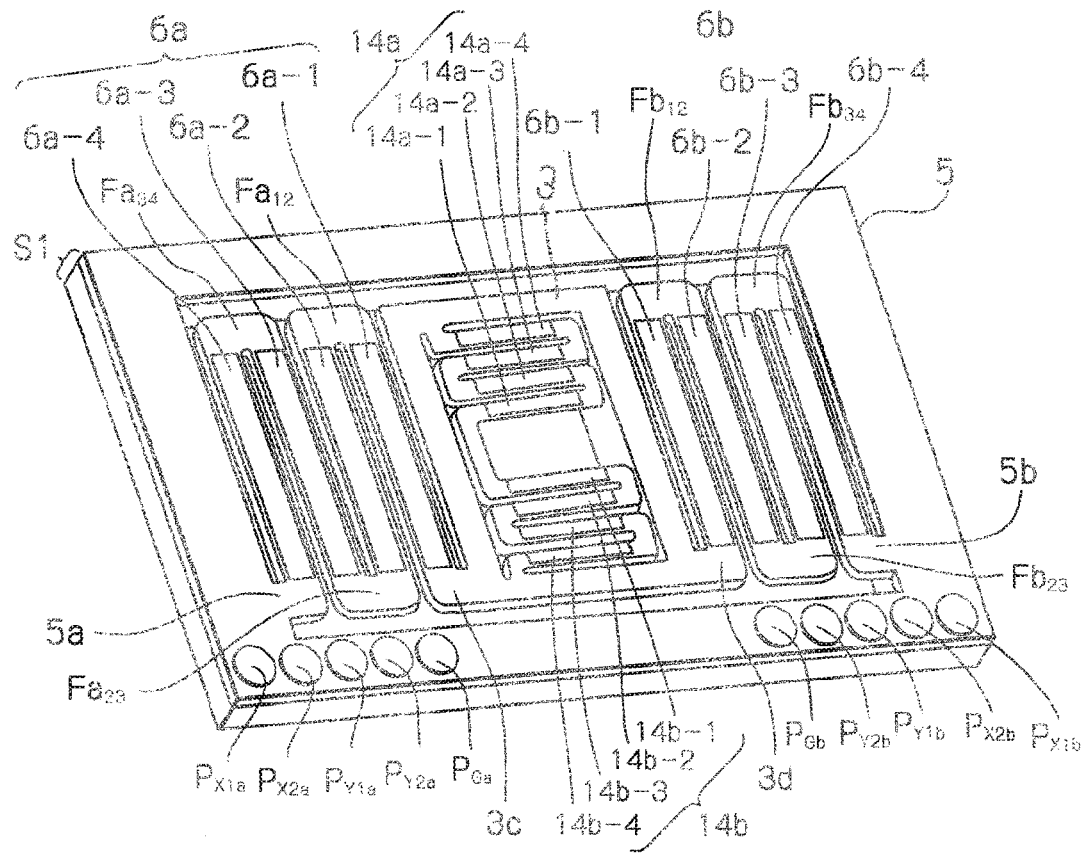
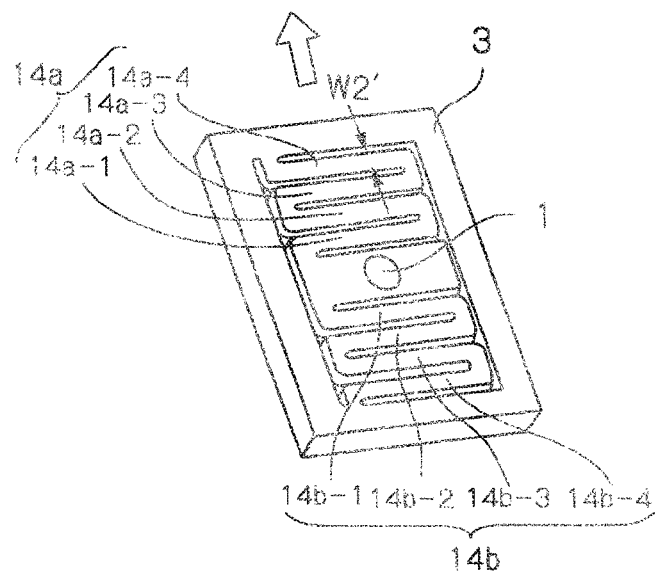

TWO-DIMENSIONAL OPTICAL DEFLECTOR INCLUDING TWO SOI STRUCTURES AND ITS MANUFACTURING METHOD

This application claims the priority benefit under 35 U.S.C. §119 to Japanese Patent Application No. JP2014-105720 filed on May 21, 2014, which disclosure is hereby incorporated in its entirety by reference.

BACKGROUND

Field

The presently disclosed subject matter relates to a two-dimensional optical deflector. The optical deflector can be applied as an optical scanner to a laser pico projector, a laser radar, a bar code reader, an area sensor, an adaptive drive beam (ADB) type head lamp, a head-up display unit, and other optical apparatuses, to generate scanning light.

Description of the Related Art

Generally, in an optical scanner or the like, an optical deflector is constructed by a micro electromechanical system (MEMS) device manufactured by using semiconductor manufacturing processes and micro machine technology.

A prior art two-dimensional optical deflector as a MEMS device is constructed by a mirror, a pair of torsion bars coupled to the mirror along an axis (X-axis), an inner frame (movable frame) surrounding the mirror and the torsion bars, inner piezoelectric actuators coupled between the torsion bars and supported by the inner frame via inner coupling portions, serving as cantilevers for rocking the mirror with respect to the X-axis of the mirror, an outer frame (fixed frame) surrounding the inner frame, and outer piezoelectric actuators coupled between the inner frame and the outer frame, serving as cantilevers for rocking the mirror along another axis (Y-axis) of the mirror (see: FIG. 19 of JP2008-040240A). The inner piezoelectric actuators are driven by a relatively high frequency such as 25 kHz for a horizontal scanning, while the outer piezoelectric actuators are driven by a relatively low frequency such as 60 Hz for a vertical scanning.

The above-described prior art two-dimensional optical deflector includes a single silicon-on-insulator (SOI) structure which is constructed by a monocrystalline silicon support layer ("Handle" layer), an intermediate (buried) silicon dioxide layer ("Box" layer) and a monocrystalline silicon active layer ("Device" layer) (see: FIGS. 25, 26, 27 and 28 of JP2008-040240A). In this case, the mirror, the torsion bars, the inner frame, the inner piezoelectric actuators and the outer piezoelectric actuators have the same thickness (height) determined by the active layer of the SOI structure. Also, a lead titanate zirconate (PZT) layer is deposited at a high temperature of 500° C. to 600° C. on the active layer of the SOI structure, and the PZT layer is patterned by a photolithography and dry etching process. On the other hand, a part of the active layer of the SOI structure is etched and exposed, and a metal is deposited as a mirror on the exposed part of the active layer of the SOI structure.

In the above-described prior art two-dimensional optical deflector, however, since the thickness of the outer piezoelectric actuators cannot be decreased while maintaining the thickness of the mirror, the torsion bars and the inner piezoelectric actuators, the frequency of the outer piezoelectric actuators would not be decreased. On the contrary, since the thickness of the inner piezoelectric actuators cannot be increased while maintaining the thickness of the outer piezoelectric actuators, the frequency of the inner piezoelectric actuators would not be increased.

Also, deposition of PZT and etching the deposited PZT may damage the surface of the active layer, so that large residual stresses would be generated in the active layer and its surface would be roughened. Therefore, the quality of the mirror would deteriorate due to the damaged surface of the active layer.

SUMMARY

The presently disclosed subject matter seeks to solve the above-described problems.

According to the presently disclosed subject matter, a two-dimensional optical deflector includes: a first SOI structure consisting of a first monocrystalline silicon support layer, a first monocrystalline silicon active layer and a first intermediate silicon dioxide layer sandwiched by the first monocrystalline silicon support layer and the first monocrystalline silicon active layer; a second SOI structure consisting of a second monocrystalline silicon support layer, a second monocrystalline silicon active layer and a second intermediate silicon dioxide layer sandwiched by the second monocrystalline silicon support layer and the second monocrystalline silicon active layer, a height of the first monocrystalline silicon active layer being smaller than a height of the second monocrystalline silicon active layer; a mirror; an inner frame surrounding the mirror; an inner piezoelectric actuator coupled between the mirror and the inner frame and adapted to rock the mirror around a first axis; an outer frame surrounding the inner frame; and an outer piezoelectric actuator coupled between the inner frame and the outer frame and adapted to rock the mirror around a second axis. The mirror includes the second monocrystalline silicon active layer without the first monocrystalline silicon active layer. The inner frame, the inner piezoelectric actuator and the outer frame include the first monocrystalline silicon active layer and the second monocrystalline silicon active layer. The outer piezoelectric actuator includes the first monocrystalline silicon active layer without the second monocrystalline silicon active layer.

Also, a method for manufacturing a two-dimensional optical deflector includes: preparing the above-mentioned first SOI structure; preparing the above-mentioned second SOI structure; forming an upper portion of the inner piezoelectric actuator and the outer piezoelectric actuator on the first monocrystalline silicon active layer; perforating a first opening in the first monocrystalline silicon support layer except for the first monocrystalline silicon support layer of the outer frame, after the upper portion forming; forming a lower portion of the mirror, the inner frame and the inner piezoelectric actuator in the second SOI structure; bonding the second SOI structure to the first SOI structure at the first opening of the first monocrystalline silicon support layer; perforating a second opening in the first monocrystalline silicon active layer for the mirror after the bonding; and forming a reflective metal layer on the second monocrystalline silicon active layer at the second opening for the mirror.

According to the presently disclosed subject matter, the height (thickness) of the first monocrystalline silicon active layer can be so small that the frequency of the outer piezoelectric actuator can be decreased. On the other hand, the height (thickness) of the second monocrystalline silicon active layer can be so large that the frequency of the inner piezoelectric actuator can be increased.

Also, the piezoelectric actuators are provided on the active layer of the first SOI structure, while the mirror is provided on the active layer of the second SOI structure, and since the mirror is not affected by the damaged surface of the active layer of the first SOI structure, the quality of the mirror can be improved.

BRIEF DESCRIPTION OF THE DRAWINGS

The above and other advantages and features of the presently disclosed subject matter will be more apparent from the following description of certain embodiments, taken in conjunction with the accompanying drawings, wherein:

FIGS. 3A, 3B and 3C are cross-sectional views for explaining the steps of bonding the second SOI structure to the first SOI structure of FIG. 2;

FIGS. 4A through 4L are cross-sectional views for explaining a method for manufacturing the portion including the first SOI structure of FIG. 2;

FIG. 9 is an exploded perspective view of the two-dimensional optical deflector of FIG. 8.

DETAILED DESCRIPTION OF EXEMPLARY EMBODIMENTS

Figure 1:
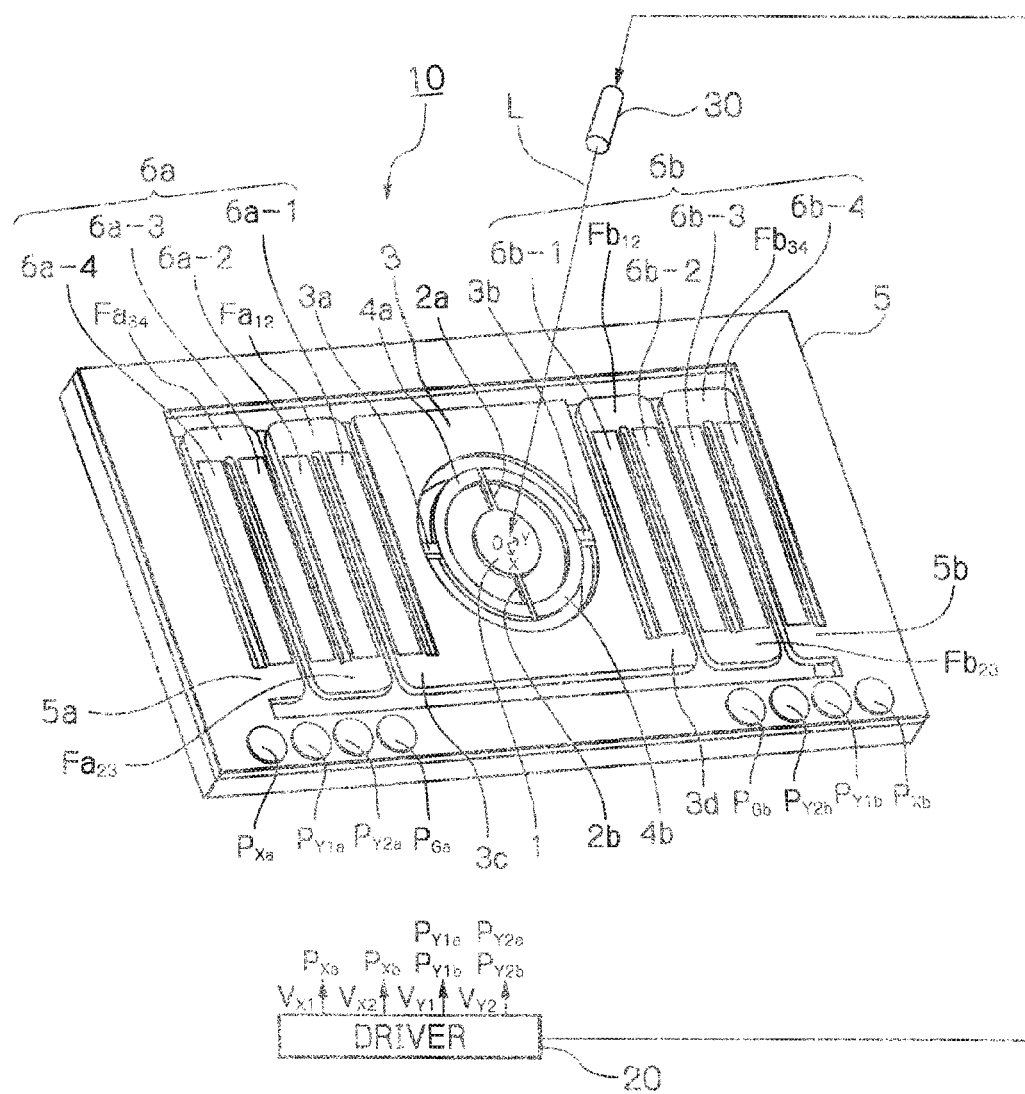
FIG. 1 is a front-side perspective view illustrating a first embodiment of the two-dimensional optical deflector according to the presently disclosed subject matter.

In FIG. 1, which illustrates a first embodiment of the two-dimensional optical deflector according to the presently disclosed subject matter, reference numeral 10 designates a two-dimensional optical deflector, 20 designates a driver for driving the optical deflector 10, and 30 designates a laser light source.

The optical deflector 10 is constructed by a circular mirror 1 for reflecting incident light L from the laser light source 30, a pair of torsion bars 2a and 2b coupled to the mirror 1 along an X-axis, an inner frame (movable frame) 3 surrounding the mirror 1 and the torsion bars 2a and 2b for supporting the mirror 1, a semi-ring shaped inner piezoelectric actuator 4a coupled between the torsion bars 2a and 2b and supported by an inner coupling portion 3a of the inner frame 3, and a semi-ring shaped inner piezoelectric actuator 4b coupled between the torsion bars 2a and 2b and supported by an inner coupling portion 3b of the inner frame 3. In this case, the inner frame 3 has a circular inner circumference along the inner piezoelectric actuators 4a and 4b, and a rectangular outer circumference. The flexing direction of the inner piezoelectric actuator 4a is opposite to that of the inner piezoelectric actuator 4b, so that the inner piezoelectric actuators 4a and 4b serve as cantilevers for rocking the mirror 1 around the X-axis.

Also, the optical deflector 10 includes an outer frame (fixed frame) 5 and a pair of meander-type outer piezoelectric actuators 6a and 6b coupled between outer coupling portions 3c and 3d of the inner frame 3 and coupling portions 5a and 5b of the outer frame 5 and serving as cantilevers for rocking the mirror 1 around a Y-axis on the plane of the mirror 1 centered at the center 0 of the mirror 1. The outer piezoelectric actuators 6a and 6b are arranged opposite to each other with respect to the mirror 1.

The mirror 1 can be square, rectangular, polygonal or elliptical. In this case, the inner-circumference of the inner frame 3 is adapted to the shape of the mirror 1.

In more detail, the torsion bars 2a and 2b have ends coupled to the outer circumference of the mirror 1 and other ends coupled to the inner circumference of the inner frame 3. Therefore, the torsion bars 2a and 2b are twisted by the inner piezoelectric actuators 4a and 4b to rock the mirror 1 around the X-axis.

The outer frame 5 is rectangular-framed to surround the inner frame 3 associated with the meander-type outer piezoelectric actuators 6a and 6b.

The meander-type outer piezoelectric actuator 6a is constructed by piezoelectric cantilevers 6a-1, 6a-2, 6a-3 and 6a-4 which are serially-coupled from the coupling portion 3c of the inner frame 3 to the coupling portion 5a of the outer frame 5 via folded portions $Fa_{12}$, $Fa_{23}$ and $Fa_{34}$. Also, each of the piezoelectric cantilevers 6a-1, 6a-2, 6a-3 and 6a-4 is in parallel with the X-axis. Therefore, the piezoelectric cantilevers 6a-1, 6a-2, 6a-3 and 6a-4 are folded at every cantilever or meandering from the inner frame 3 to the outer frame 5, so that the amplitudes of the piezoelectric cantilevers 6a-1, 6a-2, 6a-3 and 6a-4 can be changed along directions perpendicular to the Y-axis.

Similarly, the meander-type outer piezoelectric actuator 6b is constructed by piezoelectric cantilevers 6b-1, 6b-2, 6b-3 and 6b-4 which are serially-coupled from the outer coupling portion 3d of the inner frame 3 to the coupling portion 5b of the outer frame 5 via folded portions $Fb_{12}$, $Fb_{23}$ and $Fb_{34}$. Also, each of the piezoelectric cantilevers 6b-1, 6b-2, 6b-3 and 6b-4 are in parallel with the X-axis. Therefore, the piezoelectric cantilevers 6b-1, 6b-2, 6b-3 and 6b-4 are folded at every cantilever or meandering from the inner frame 3 to the outer frame 5, so that the piezoelectric cantilevers 6b-1, 6b-2, 6b-3 and 6b-4 can be changed along directions perpendicular to the Y-axis.

The meander-type outer piezoelectric actuators 6a and 6b operate as follows.

In the outer piezoelectric actuators 6a and 6b, the piezoelectric cantilevers 6a-1, 6a-2, 6a-3, 6a-4, 6b-1, 6b-2, 6b-3 and 6b-4 are divided into an odd-numbered group of the piezoelectric cantilevers 6a-1 and 6a-3; 6b-1 and 6b-3, and an even-numbered group of the piezoelectric cantilevers 6a-2 and 6a-4; 6b-2 and 6b-4 alternating with the odd-numbered group of the piezoelectric cantilevers 6a-1 and 6a-3; 6b-1 and 6b-3.

For example, when the odd-numbered group of the piezoelectric cantilevers 6a-1, 6a-3, 6b-1 and 6b-3 are flexed in one direction, for example, in an upward direction, the even-numbered group of the piezoelectric cantilevers 6a-2, 6a-4, 6b-2 and 6b-4 are flexed in the other direction, i.e., in a downward direction. On the other hand, when the odd-numbered group of the piezoelectric cantilevers 6a-1, 6a-3, 6b-1 and 6b-3 are flexed in the downward direction, the even-numbered group of the piezoelectric cantilevers 6a-2, 6a-4, 6b-2 and 6b-4 are flexed in the upward direction. In this case, since the length of each of the piezoelectric cantilevers 6a-1, 6a-4, 6b-1 and 6b-4 is about half of that of each of the piezoelectric cantilevers 6a-2, 6a-3, 6b-2 and 6b-3, the flexing amounts of the piezoelectric cantilevers 6a-1, 6a-4, 6b-1 and 6b-4 are about half of those of the piezoelectric cantilevers 6a-2, 6a-3, 6b-2 and 6b-3.

Thus, the mirror 1 is rocked around the Y-axis.

Note that the number of piezoelectric cantilevers in each of the outer piezoelectric actuators 6a and 6b can be other values such as 3, 5, 6, 7, . . . .

Provided on the outer frame 5 are pads $P_{Ga}$, $P_{Xa}$, $P_{Y1a}$, $P_{Y2a}$, $P_{Gb}$, $P_{Xb}$, $P_{Y1b}$ and $P_{Y2b}$ which are connected to the driver 20. The driver 20 applies a drive voltage $V_{X1}$ to the pad $P_{Xa}$ and applies a drive voltage $V_{X2}$ to the pad $P_{Xb}$. The drive voltages $V_{X1}$ and $V_{X2}$ are sinusoidal, and the drive voltage $V_{X1}$ is opposite in phase to the drive voltage $V_{X2}$. For example, the frequency $f_X$ of the drive voltages $V_{X1}$ and $V_{X2}$ is one resonant frequency $f_r$ such as 25 kHz depending upon a resonant structure formed by the mirror 1, the torsion bars 2a and 2b and the inner piezoelectric actuators 4a and 4b. On the other hand, the driver 20 applies a drive voltage $V_{Y1}$ to the pads $P_{Y1a}$ and $P_{Y1b}$, and applies a drive voltage $V_{Y2}$ to the pads $P_{Y2a}$ and $P_{Y2b}$. The drive voltages $V_{Y1}$ and $V_{Y2}$ are sinusoidal or saw-tooth-shaped, and the drive voltage $V_{Y1}$ opposite in phase to the drive voltage $V_{Y2}$. For example, the frequency $f_Y$ of the drive voltages $V_{Y1}$ and $V_{Y2}$ is 60 Hz, much lower than the resonant frequency $f_r$.

The pad $P_{Ga}$, which is grounded, is connected via a via-structure (not shown) to the lower electrode layers 106 (see: FIG. 4C) of the inner piezoelectric actuator 4a and the piezoelectric cantilevers 6a-1, 6a-2, 6a-3 and 6a-4 of the outer piezoelectric actuator 6a.

The pad $P_{Xa}$ is connected via a wiring layer (not shown) to the upper electrode layers 108 (see: FIG. 4C) of the inner piezoelectric actuator 4a.

The pad $P_{Y1a}$ is connected via a wiring layer (not shown) to the upper electrode layers 108 (see: FIG. 4C) of the odd-numbered piezoelectric cantilevers 6a-1 and 6a-3 of the outer piezoelectric actuator 6a.

The pad $P_{Y2a}$ is connected via a wiring layer (not shown) to the upper electrode layers 108 (see: FIG. 4C) of the even-numbered piezoelectric cantilevers 6a-2 and 6a-4 of the outer piezoelectric actuator 6a.

The pad $P_{Gb}$, which is grounded, is connected via a via-structure (not shown) to the lower electrode layers 106 (see: FIG. 4C) of the inner piezoelectric actuator 4b and the piezoelectric cantilevers 6b-1, 6b-2, 6b-3 and 6b-4 of the outer piezoelectric actuator 6b.

The pad $P_{Xb}$ is connected via a wiring layer (not shown) to the upper electrode layers 108 (see: FIG. 4C) of the inner piezoelectric actuator 4b.

The pad $P_{Y1b}$ is connected via a wiring layer (not shown) to the upper electrode layers 108 (see: FIG. 4C) of the odd-numbered piezoelectric cantilevers 6b-1 and 6b-3 of the outer piezoelectric actuator 6b.

The pad $P_{Y2b}$ is connected via a wiring layer (not shown) to the upper electrode layers 108 (see: FIG. 4C) of the even-numbered piezoelectric cantilevers 6b-2 and 6b-4 of the outer piezoelectric actuator 6b.

The driver 20 is constructed by a control circuit such as a microcomputer including a central processing unit (CPU), a read-only memory (ROM) or a nonvolatile memory, a random access memory (RAM), an input/output (I/O) interface and the like.

Figure 2:
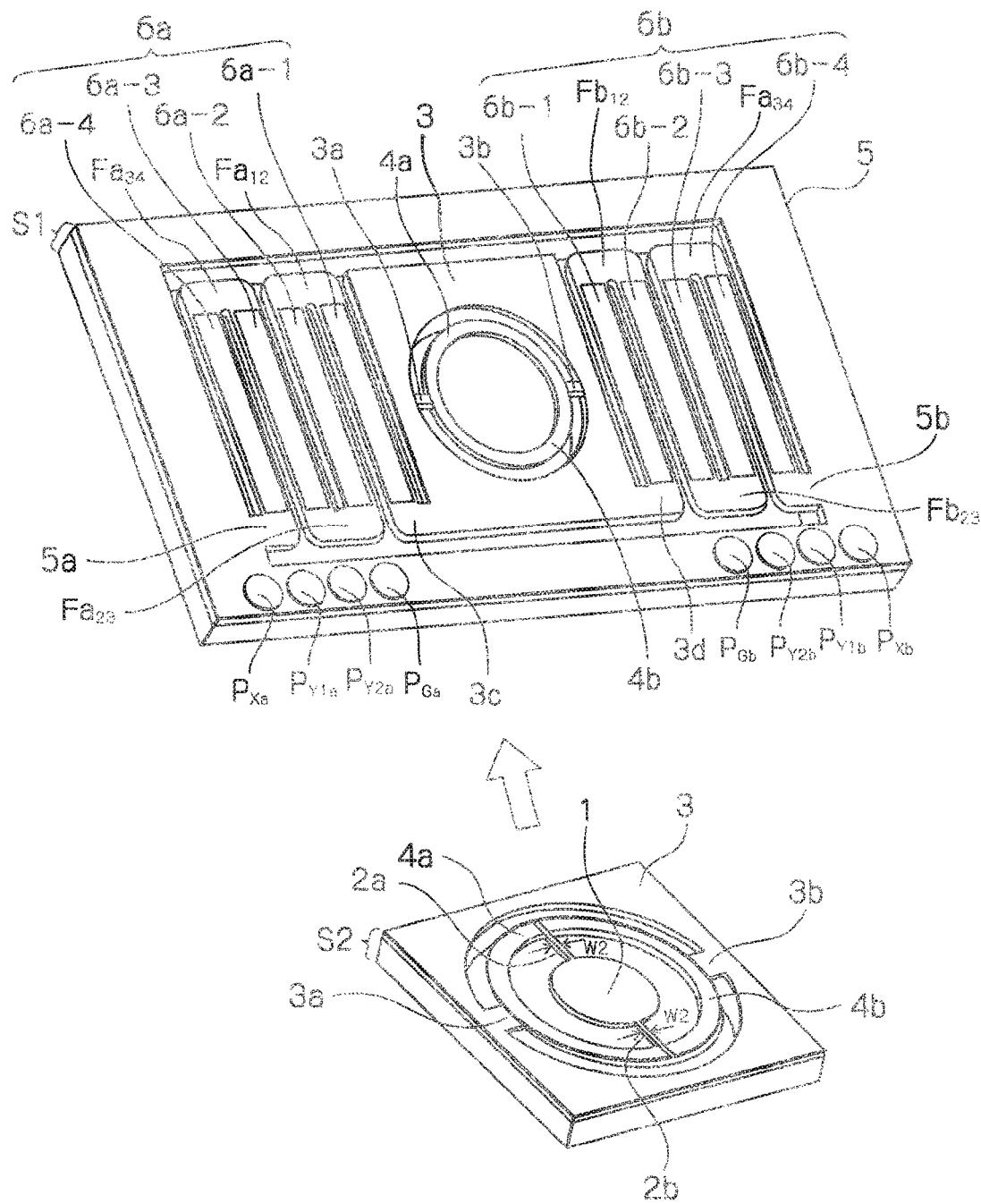
FIG. 2 is an exploded perspective view of the two-dimensional optical deflector of FIG. 1.

The optical deflector 10 of FIG. 1 is divided into a portion including a first SOI structure S1 and a portion including a second SOI structure S2 as illustrated in FIG. 2, which is an exploded perspective view of the optical deflector of FIG. 1.

In FIG. 2, the mirror 1 and the torsion bars 2a and 2b include only the second SOI structure S2; the inner frame 3 and the inner piezoelectric actuators 4a and 4b include the first SOI structure S1 and the second SOI structure S2; and the outer frame 5 and the outer piezoelectric actuators 6a and 6b include only the first SOI structure S1.

Figure 3A:
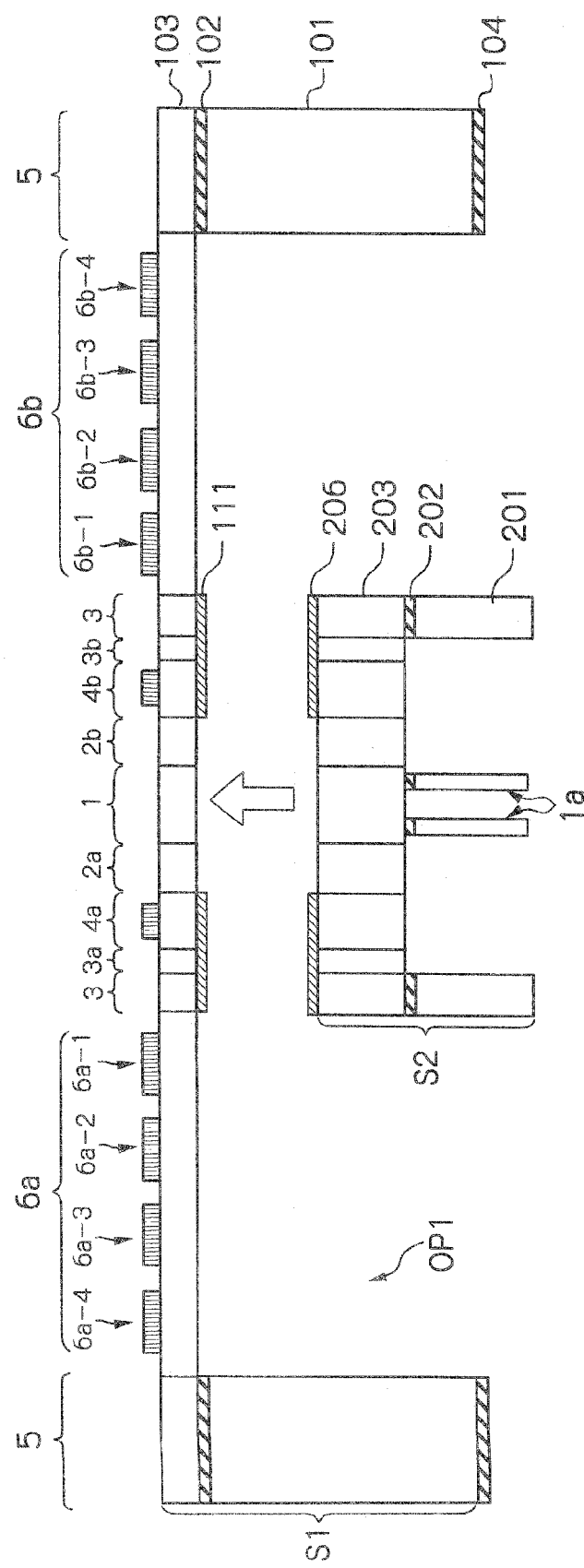
Figure 3C:
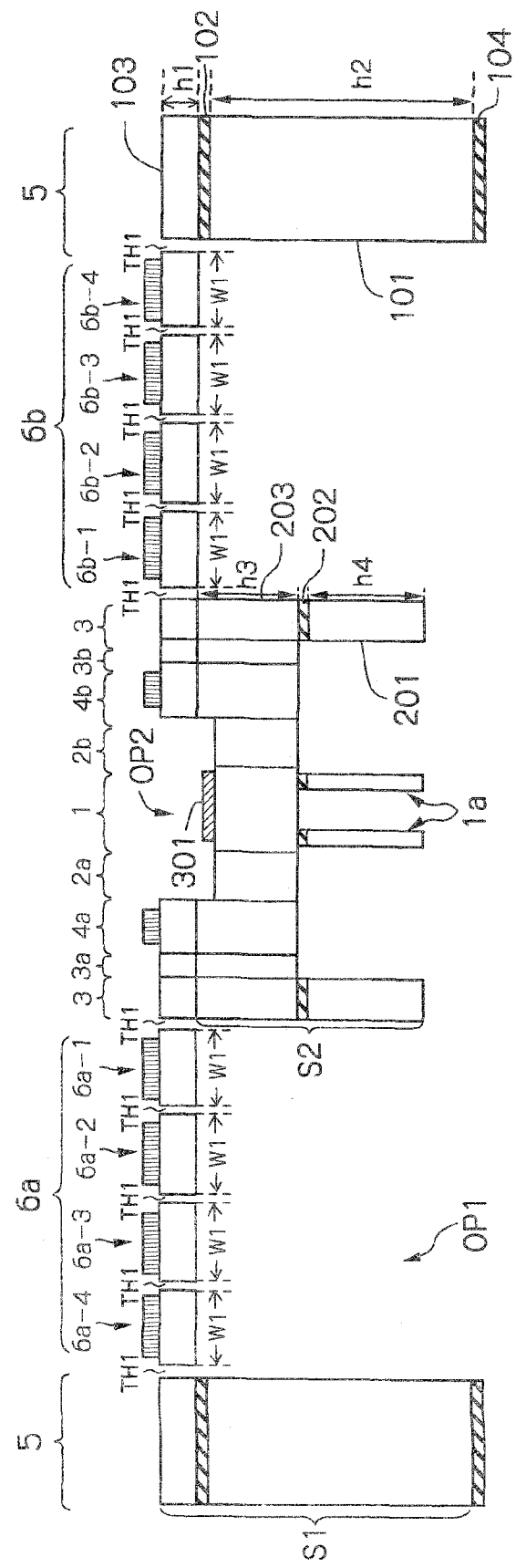

Steps of bonding the second SOI structure S2 to the first SOI structure S1 are illustrated in FIGS. 3A, 3B and 3C.

First, referring to FIG. 3A, the first SOI structure S1 is constructed by a monocrystalline silicon support layer ("Handle" layer) 101, an intermediate (buried) silicon dioxide layer ("Box" layer) 102, and a monocrystalline silicon active layer ("Device" layer) 103. Also, a silicon dioxide layer 104 is formed on the support layer 101. Further, piezoelectric actuator cantilevers 4a, 4b, 6a-1, 6a-2, 6a-3 and 6a-4, 6b-1, 6b-2, 6b-3 and 6b-4 are formed on the active layer 103. Further, an Au bonding layer 111 is formed on the back surface of the active layer 103. In this case, the formation of elements on the active layer 103 is completed, while the active layer 103 is not perforated for the mirror 1. Further, an opening OP1 is perforated in the support layer 101 and the intermediate silicon dioxide layer 102 for accommodating the second SOI structure S2. On the other hand, the second SOI structure S2 is constructed by a monocrystalline silicon support layer ("Handle" layer) 201, an intermediate (buried) silicon dioxide layer ("Box" layer) 202, and a monocrystalline silicon active layer ("Device" layer) 203. Also, an Au bonding layer 206 is formed on the front surface of the active layer 203. In this case, the formation of the mirror 1 on the active layer 203 is not completed.

In FIG. 3A, a plurality of SOI structures S1 are arranged in a grid in an SOI wafer, while the SOI structure S2 is diced in advance from an SOI wafer by a dicing process.

Next, referring to FIG. 3B, the second SOI structure S2 is provisionally bonded to the SOI structure S1 by pressuring the Au bonding layer 206 of the SOI structure 32 onto the Au bonding layer 111 of the SOI structure S1.

Finally, referring to FIG. 3C, the SOI structure S1 and the SOI structure S2 are heated at a temperature of 300° C. to 400° C., so that the SOI structure S1 is surely secured to the SOI structure S1 by a Au-to-Au bond.

The Au-to-Au bond is carried out by solid phase diffusion, so that a silicon interface would appear in the break surfaces of the Au-to-Au bond by a tensile test. However, the Au-to-Au bond can be replaced by a direct Si-to-Si bond, an anodic oxidation bond of Si-to-SiO$_2$, an AuSn eutectic bond, a soldering bond, a frit-glass bond, a Cu-to-Cu bond or an adhesive bond.

Also, an opening OP2 and through holes TH1 are perforated in the active layer 103. Further, an aluminum (Al) reflective metal layer 301 is formed on the active layer 203 within the opening OP2. Thus, the piezoelectric cantilevers 6a-1, 6a-2, 6a-3, 6a-4, 6b-1, 6b-2, 6b-3 and 6b-4 are separated by the through holes TH, so that the piezoelectric cantilevers 6a-1, 6a-2, 6a-3, 6a-4, 6b-1, 6b-2, 6b-3 and 6b-4 can be individually moved.

Then, the SOI structure S1 is diced from an SOI wafer including a large number of SOI structures S1.

The height h1 of the active layer 103 and the height h2 of the support layer 101 in the first SOI structure S1, the height h3 of the active layer 203 and the height h4 of the support layer 201 in the second SOI structure S2, the width W1 of the piezoelectric cantilevers 6a-1, 6a-2, 6a-3, 6a-4, 6b-1, 6b-2, 6b-3 and 6b-4 and the width W2 (see: FIG. 2) of the torsion bars 2a and 2b are individually determined by the following:

$$h1 < h3 \quad (1)$$

$$h2 > h3 + h4 \quad (2)$$

$$W1 > 8 \cdot h1 \quad (3)$$

$$W2 < 2 \cdot h3 \quad (4)$$

Note that the thickness (height) of the intermediate (buried) silicon dioxide layer 102 (202) is much smaller than the heights h1 and h2 (h3 and h4), and therefore, the height of the intermediate (buried) silicon dioxide layers 102 (202) can be negligible.

According to the formula (1), the mirror 1 and the torsion bars 2a and 2b can be so thick as to increase the rigidities of thereof, so that the resonant frequency $f_X$ can be sufficiently increased to 20 kHz, for example. In this case, the pumping phenomenon where the mirror 1 vibrates in a direction normal to the X-Y plane can be avoided. On the other hand, the piezoelectric cantilevers 6a-1, 6a-2, 6a-3, 6a-4, 6b-1, 6b-2, 6b-3 and 6b-4 can be so thin as to decrease the rigidities of thereof, so that the non-resonant frequency $f_Y$ can be sufficiently decreased to 60 Hz, for example.

According to the formula (2), the second SOI structure S2 is completely accommodated in the opening OP1 of the first SOI structure S1. Therefore, even when the height h3 of the active layer 203 is larger than the height h1 of the active layer 103 by the formula (1), it is possible to prevent the second SOI structure S2 from being under the bottom of the first SOI structure S1.

According to the formula (3), the areas of the PZT layers of the piezoelectric cantilevers 6a-1, 6a-2, 6a-3, 6a-4, 6b-1, 6b-2, 6b-3 and 6b-4 are increased to enhance the drive power thereof, thus enlarging the amplitude of the flexing amount of the mirror 1 along the Y-axis.

According to the formula (4), the rigidities of the torsion bars 2a and 2b can be enhanced to avoid the pumping phenomenon of the mirror 1.

A method for manufacturing the portion including the SOI structure S1 of FIG. 3C will be explained in more detail with reference to FIGS. 4A through 4L.

First, referring to FIG. 4A, an SOI wafer formed by an about 350 μm thick monocrystalline silicon support layer ("Handle" layer) 101, an about 1 μm thick intermediate (buried) silicon dioxide layer ("Box" layer) 102 and an about 40 μm thick monocrystalline silicon active layer ("Device" layer) 103 is prepared. Then, the SOI wafer is oxidized by a thermal oxidation process, so that about 1 μm thick silicon dioxide layers 104 and 105 are formed on both surfaces of the SOI wafer.

Next, referring to FIG. 4B, a Pt/Ti lower electrode layer 106 consisting of an about 50 nm thick Ti and an about 150 nm thick Pt on Ti is formed by a sputtering process. Then, an about 3 μm thick PZT layer 107 is deposited on the lower electrode layer 106 by an arc discharge reactive ion plating (ADRIP) process at a temperature of about 500° C. to 600° C. Then, an about 150 nm thick Ti upper electrode layer 108 is formed on the PZT layer 107 by a sputtering process.

Next, referring to FIG. 4C, the upper electrode layer 108 and the PZT layer 107 are patterned by a photolithography and etching Process. Then, the lower electrode layer 106 and the silicon dioxide layer 105 are patterned by a photolithography and etching process.

Next, referring to FIG. 4D, an about 500 nm thick silicon dioxide interlayer 109 is formed on the entire surface by a plasma chemical vapor deposition (CVD) process.

Next, referring to FIG. 4E, contact holes CONT are perforated in the silicon dioxide interlayer 109 by a photolithography and dry etching process. The contact holes CONT correspond to the piezoelectric actuators 4a and 4b, the piezoelectric cantilevers 6a-1, 6a-2, 6a-3, 6a-4, 6b-1, 6b-2, 6b-3, 6b-4, the pads $P_{Xa}$, $P_{Y1a}$, $P_{Y2a}$, $P_{Ga}$, $P_{Xb}$, $P_{Y1b}$, $P_{Y2b}$ and $P_{Gb}$.

Next, referring to FIG. 4F, wiring layers 110 made of AlCu (1% Cu) are formed by a photolithography process, a sputtering process, and a lift-off process. The wiring layers 110 are electrically connected between the upper electrode layers 108 of the piezoelectric actuators 4a and 4b, and the piezoelectric cantilevers 6a-1, 6a-2, 6a-3, 6a-4, 6b-1, 6b-2, 6b-3 and 6b-4 and their corresponding pads $P_{Xa}$, $P_{Y1a}$, $P_{Y2a}$, $P_{Ga}$, $P_{Xb}$, $P_{Y1b}$, $P_{Y2b}$ and $P_{Gb}$.

Next, referring to FIG. 4G, the silicon dioxide layer 104 is etched by a photolithography and dry etching process, so that the silicon dioxide layer 104 is left in an area corresponding to the outer frame 5.

Next, referring to FIG. 4H, the support layer 101 is etched by a dry etching process using the silicon dioxide layer 104 as an etching mask. Then, the silicon dioxide layer 102 is etched by a wet etching process using the support layer 101 as an etching mask. Thus, an opening OP1 is perforated in the support layer 101 and the silicon dioxide layer 102.

Next, referring to FIG. 4I, an Au bonding layer 111 is deposited on the back surface of the active layer 103, and is patterned, so that the Au bonding layer 111 corresponds to the piezoelectric actuators 4a and 4b, the inner frame 3 (see: FIG. 3A). In this case, note that a TiW underlayer (not shown) is formed between the active layer 103 and the Au bonding layer 110, thus preventing suicide from being grown between Au and Si.

Next, referring to FIG. 4J, the portion including the SOI structure S2 is bonded to the Au bonding layer 110. Note that the portion including the SOI structure S2 which is completed except for the mirror 1 will be explained later in detail. An Au-to-Au bonding process between the Au bonding layer 111 and the Au bonding layer 206 (see: FIG. 5E) of the SOI structure S2 is carried out for about 10 minutes under the following conditions:

pressure: less than 0.1 atm
temperature: 250° C.,
load: 7000 N

Note that the temperature of 250° C. hardly affects the quality of the mirror 1.

Next, referring to FIG. 4K, an opening OP2 and through holes THI are perforated in the active layer 103 by a deep-reactive ion etching (RIE) process. The opening OP2 is used for forming the mirror 1 on the SOI structure S2, and the through holes TH separate the piezoelectric cantilevers 6a-1, 6a-2, 6a-3, 6a-4, 6b-1, 6b-2, 6b-3 and 6b-4 from each other (see: FIG. 3C).

Finally, referring to FIG. 4L, an aluminum (Al) reflective metal layer 211 is formed by an evaporation process, and is patterned by a photolithography and etching process, thus completing the optical deflector.

A method for manufacturing the portion including the SOI structure S2 of FIG. 3C will be explained in more detail with reference to FIGS. 5A through 5E.

Figure 5A:
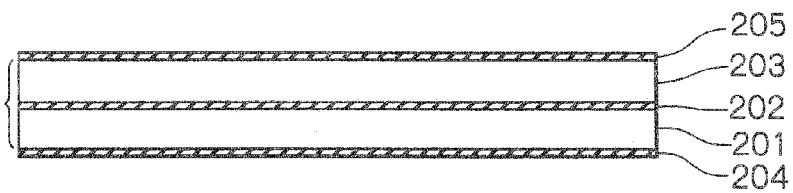
FIGS. 5A through 5E are cross-sectional views for explaining a method for manufacturing the portion including the second SOI structure of FIG. 2.

First, referring to FIG. 5A, an SOI wafer formed by an about 200 μm thick monocrystalline silicon support layer ("Handle" layer) 201, an about 1 μm thick intermediate (buried) silicon dioxide layer ("Box" layer) 202 and an about 100 μm thick monocrystalline silicon active layer ("Device" layer) 203 is prepared. In this case, the height h3 (=100 μm) of the active layer 203 is larger than the height h1 (=40 μm) of the active layer 103 of the SOI structure S1 (h3>h1). Also, a total of the heights (h3+h4=300 μm) of the active layer 203 and the support layer 201 is smaller than the height h2 (=350 μm) of the support layer 101 of the SOI structure S1 (h2>h3+h4). Then, the SOI wafer is oxidized by a thermal oxidation process, so that about 1 μm thick silicon dioxide layers 204 and 205 are formed on both surfaces of the SOI wafer.

Figure 5B:
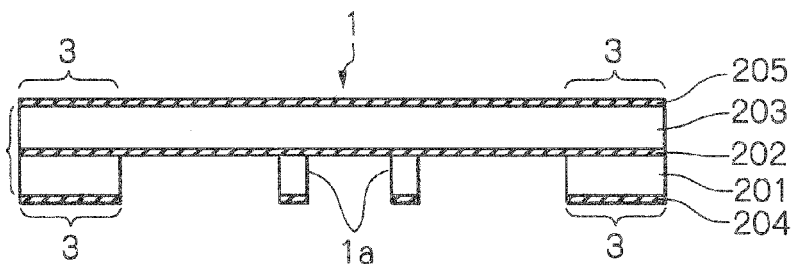

Next, referring to FIG. 5B, a deep-RIE process is performed upon the silicon dioxide layer 204 and the support layer 201, to form a cylindrical reinforcement rib 1a of the mirror 1, and a lower portion of the inner frame 3.

Figure 5C:
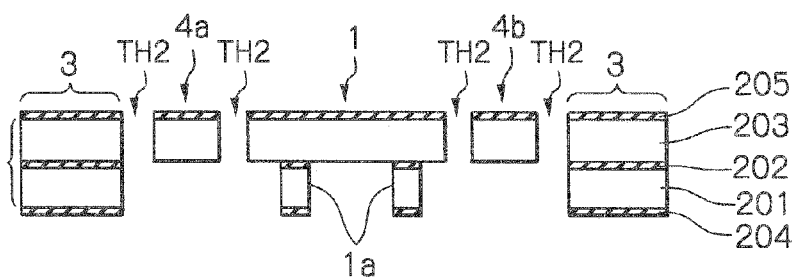

Next, referring to FIG. 5C, a deep-RIE process is performed upon the silicon dioxide layer 205 and the active layer 203, to form through holes TH2. As a result, the piezoelectric actuators 4a and 4b are separated from the mirror 1 and the inner frame 3 (see: FIG. 2). In this case, note that the piezoelectric actuators 4a and 4b are coupled via the torsion bars 2a and 2b to the mirror 1, and also, the piezoelectric actuators 4a and 4b are coupled via the inner coupling portions 3a and 3b to the inner frame 3 (see: FIG. 2, 3A, 3B and 3C).

Figure 5D:
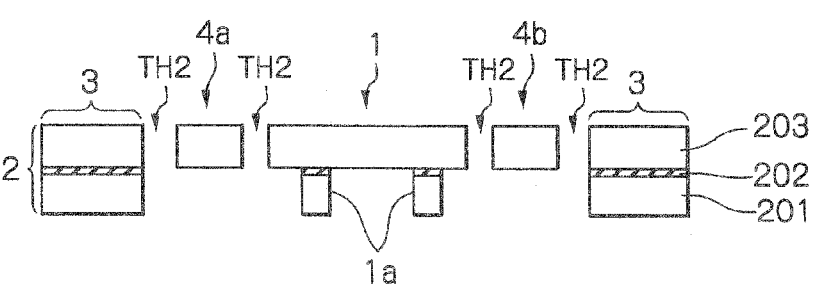
Figure 5E:
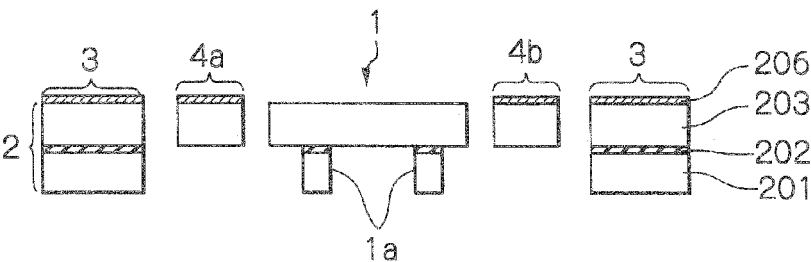

Next, referring to FIG. 5D, the silicon dioxide layer 201 is removed by a buffered oxide etching (BOE) process using buffered fluoric acid.

Finally, referring to FIG. 5E, an Au bonding layer 206 is deposited on the front surface of the active layer 203, and is patterned, so that the Au bonding layer 206 corresponds to the piezoelectric actuators 4a and 4b, the inner frame 3 (see: FIG. 3A). In this case, note that a TiW underlayer (not shown) is formed between the active layer 203 and the Au bonding layer 206, thus preventing silicide from being grown between Au and Si.

Figure 6:
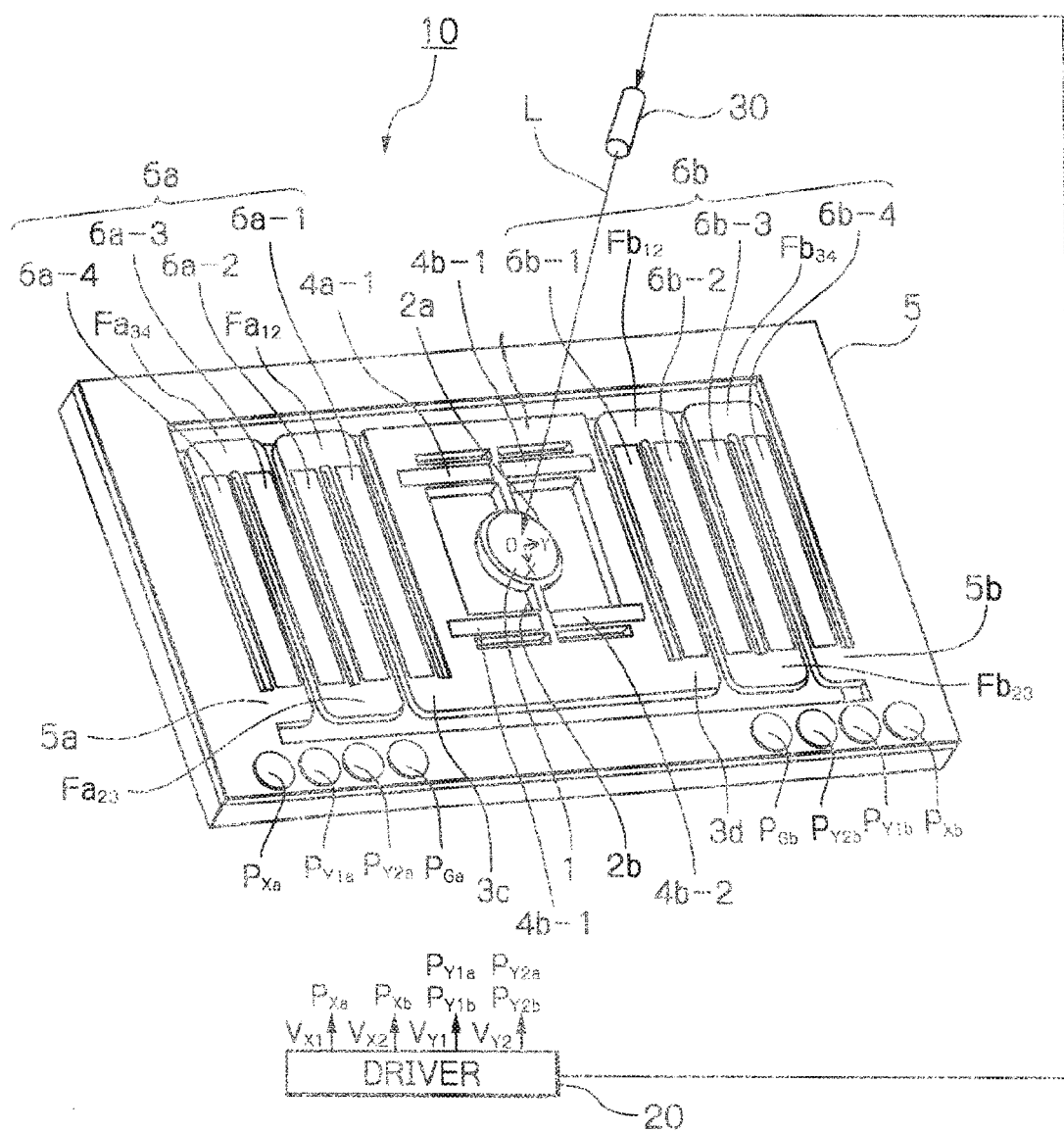
FIG. 6 is a front-side perspective view illustrating a modification of the two-dimensional optical deflector of FIG. 1.

In FIG. 6, which is a perspective view illustrating a modification of the three-dimensional optical deflector of FIG. 1, the semi-ring shaped inner piezoelectric actuator 4a of FIG. 1 is replaced by two linear inner piezoelectric actuators 4a-1 and 4a-2 which are commonly controlled by the voltage at the pad $P_{xa}$, and the semi-ring shaped inner piezoelectric actuator 4b of FIG. 1 is replaced by two linear inner piezoelectric actuators 4b-1 and 4b-2 which are controlled by the voltage at the pad $P_{xb}$. The inner piezoelectric actuators 4a-1 and 4b-1 sandwich the torsion bar 2a, and the inner piezoelectric actuators 4a-2 and 4b-2 sandwich the torsion bar 2b.

Figure 7:
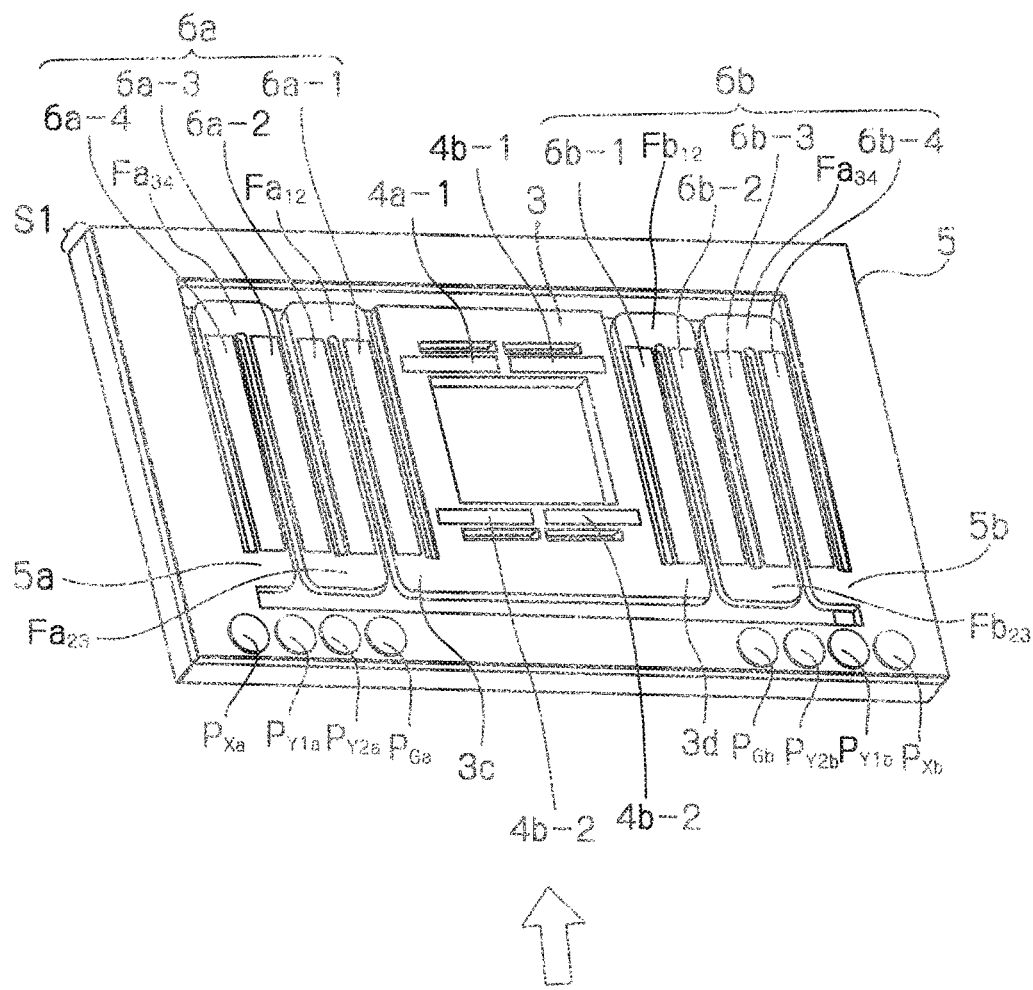
FIG. 7 is an exploded perspective view of the two-dimensional optical deflector of FIG. 6.

The optical deflector 10 of FIG. 6 is divided into a portion including a first SOI structure S1 and a portion including a second SOI structure S2 as illustrated in FIG. 7, which is an exploded perspective view of the optical deflector of FIG. 6.

Even in FIG. 7, the mirror 1 and the torsion bars 2a and 2b include only the second SOI structure S2; the inner frame 3, the inner piezoelectric actuators 4a-1, 4a-2, 4b-1 and 4b-2 include the first SOI structure S1 and the second SOI structure S2; and the outer frame 5 and the outer piezoelectric actuators 6a and 6b include only the first SOI structure S1.

Figure 8:
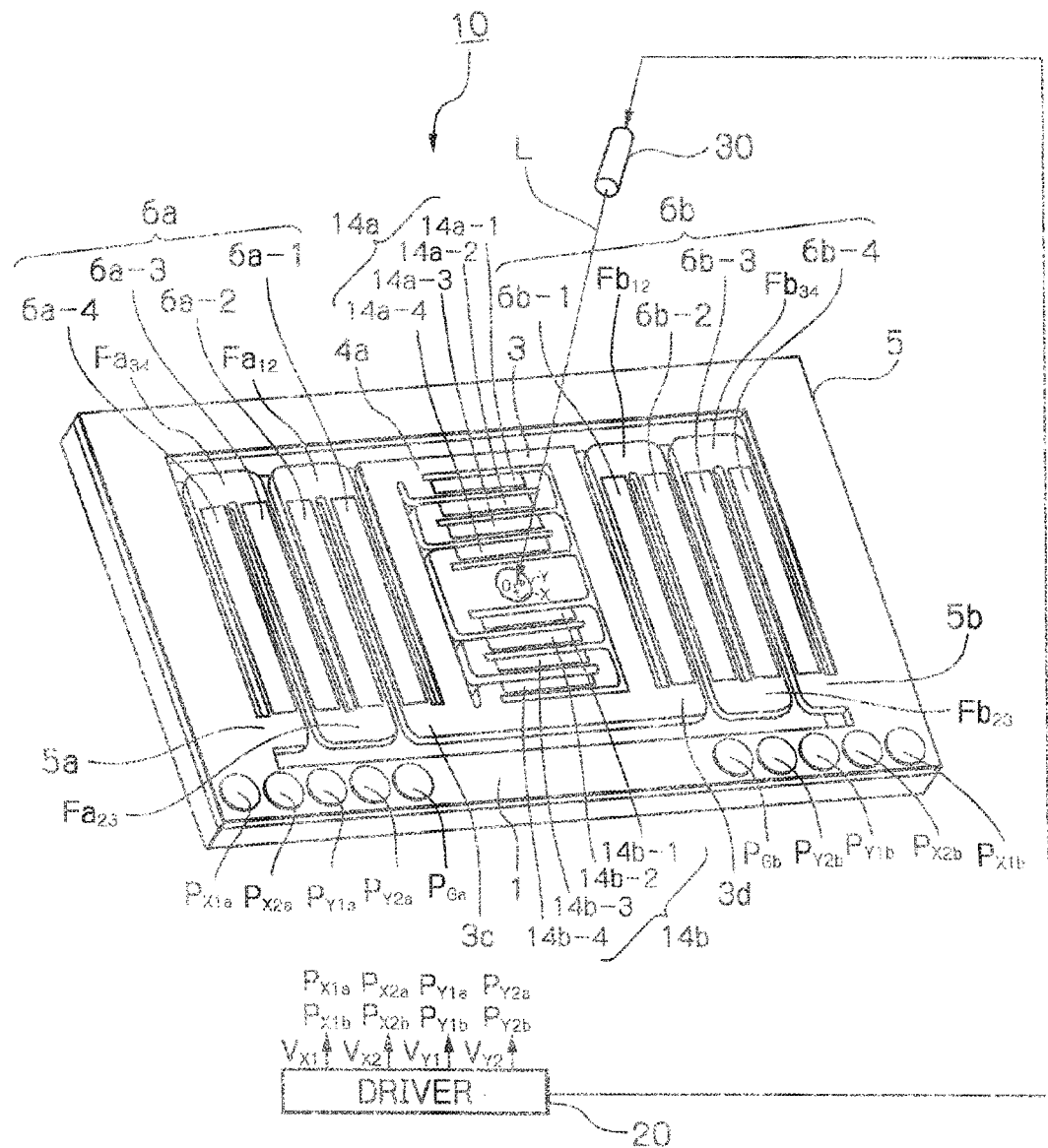
FIG. 8 is a front-side perspective view illustrating a second embodiment of the two-dimensional optical deflector according to the presently disclosed subject matter.

In FIG. 8, which illustrates a second embodiment of the two-dimensional optical deflector according to the presently disclosed subject matter, the torsion bars 2a and 2b and the inner piezoelectric actuators 4a and 4b of FIG. 1 are replaced by a pair of meander-type inner piezoelectric actuators 14a and 14b coupled between the mirror 1 and the inner frame 3 and serving as cantilevers for rocking the mirror 1 around the X-axis. The inner piezoelectric actuators 14a and 14b are arranged opposite to each other with respect to the mirror 1.

The meander-type outer piezoelectric actuator 14a is constructed by piezoelectric cantilevers 14a-1, 14a-2, 14a-3 and 14a-4 which are serially-coupled from the mirror 1 to the inner frame 3. Also, each of the piezoelectric cantilevers 14a-1, 14a-2, 14a-3 and 14a-4 is in parallel with the Y-axis. Therefore, the piezoelectric cantilevers 14a-1, 14a-2, 14a-3 and 14a-4 are folded at every cantilever or meandering from the mirror 1 to the inner frame 3, so that the amplitudes of the piezoelectric cantilevers 14a-1, 14a-2, 14a-3 and 14a-4 can be changed along directions perpendicular to the X-axis.

Similarly, the meander-type outer piezoelectric actuator 14b is constructed by piezoelectric cantilevers 14b-1, 14b-2, 14b-3 and 14b-4 which are serially-coupled from the mirror 1 to the inner frame 3. Also, each of the piezoelectric cantilevers 14b-1, 14b-2, 14b-3 and 14b-4 are in parallel with the Y-axis. Therefore, the piezoelectric cantilevers 14b-1, 14b-2, 14b-3 and 14b-4 are folded at every cantilever or meandering from the mirror 1 to the inner frame 3, so that the piezoelectric cantilevers 14b-1, 14b-2, 14b-3 and 14b-4 can be changed along directions perpendicular to the X-axis.

The meander-type inner piezoelectric actuators 14a and 14b operate in the same way as the meander-type outer piezoelectric actuators 6a and 6b.

Thus, the mirror 1 is rocked around the X-axis.

Note that the number of piezoelectric cantilevers in each of the inner piezoelectric actuators 14a and 14b can be other values such as 3, 5, 6, 7, . . . .

Provided on the outer frame 5 are further pads $P_{X1a}$, $P_{X2a}$, $P_{X1b}$ and $P_{X2b}$ instead of the pads $P_{Xa}$ and $P_{Xb}$ of FIG. 1. The driver 20 applies the drive voltage $V_{X1}$ the pads $P_{X1a}$, $P_{X1b}$ and applies the drive voltage $V_{X2}$ to the pads $P_{X2a}$ and $P_{X2b}$.

The pad $P_{X1a}$ is connected to the odd-numbered piezoelectric cantilevers 14a-1 and 14a-3 of the inner piezoelectric actuator 14a.

The pad $P_{X2a}$ is connected the even-numbered piezoelectric cantilevers 14a-2 and 14a-4 of the inner piezoelectric actuator 14a.

The pad $P_{X1b}$ is connected to the odd-numbered piezoelectric cantilevers 14b-1 and 14b-3 of the inner piezoelectric actuator 14b.

The pad $P_{X2b}$ is connected the even-numbered piezoelectric cantilevers 14b-2 and 14b-4 of the inner piezoelectric actuator 14b.

The optical deflector 10 of FIG. 8 is divided into a portion including a first SOI structure S1 and a portion including a second SOI structure S2 as illustrated in FIG. 9, which is an exploded perspective view of the optical deflector of FIG. 8.

In FIG. 9, the mirror 1 includes only the second SOI structure S2; the inner frame 3 and the inner piezoelectric actuators 14a and 14b include the first SOI structure S1 and the second SOI structure S2; and the outer frame 5 and the outer piezoelectric actuators 14a and 14b include only the first SOI structure S1.

Figure 10A:
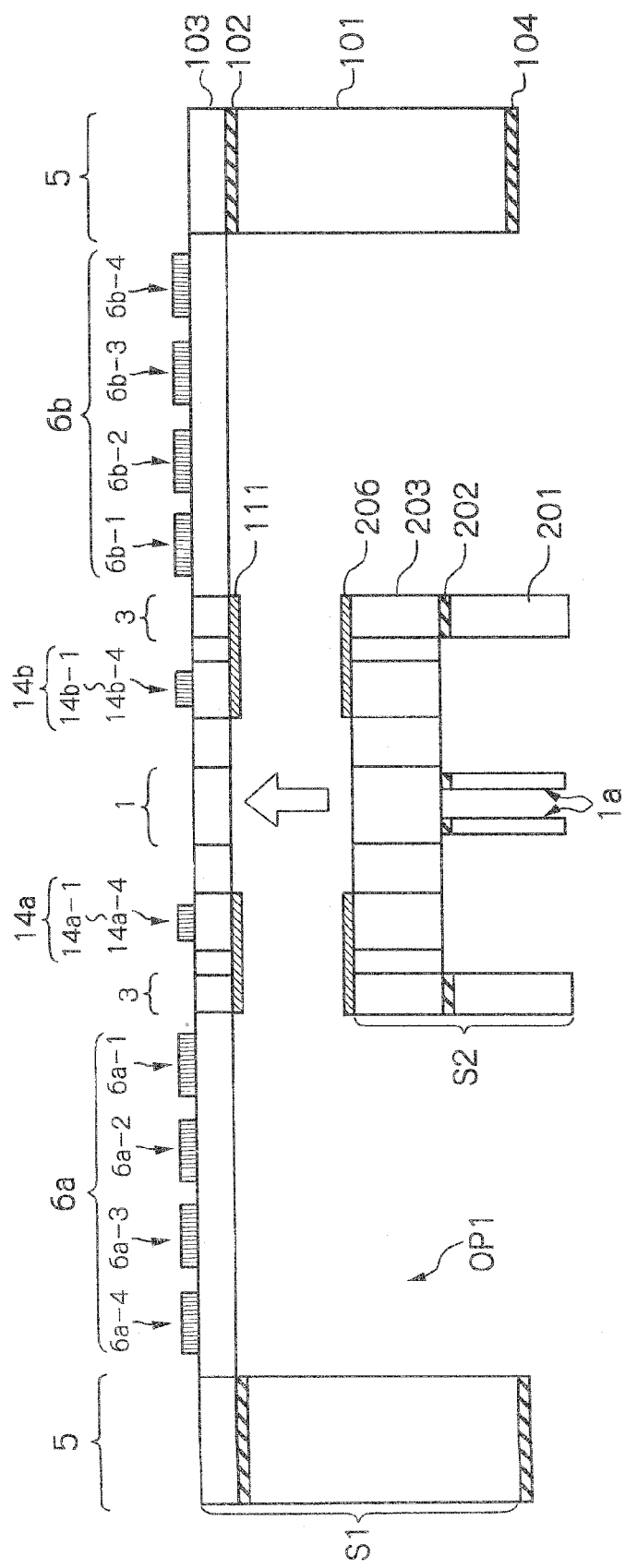
FIGS. 10A, 10B and 10C are cross-sectional views for explaining the steps of bonding the second SOI structure to the first SOI structure of FIG. 9.
Figure 10B:
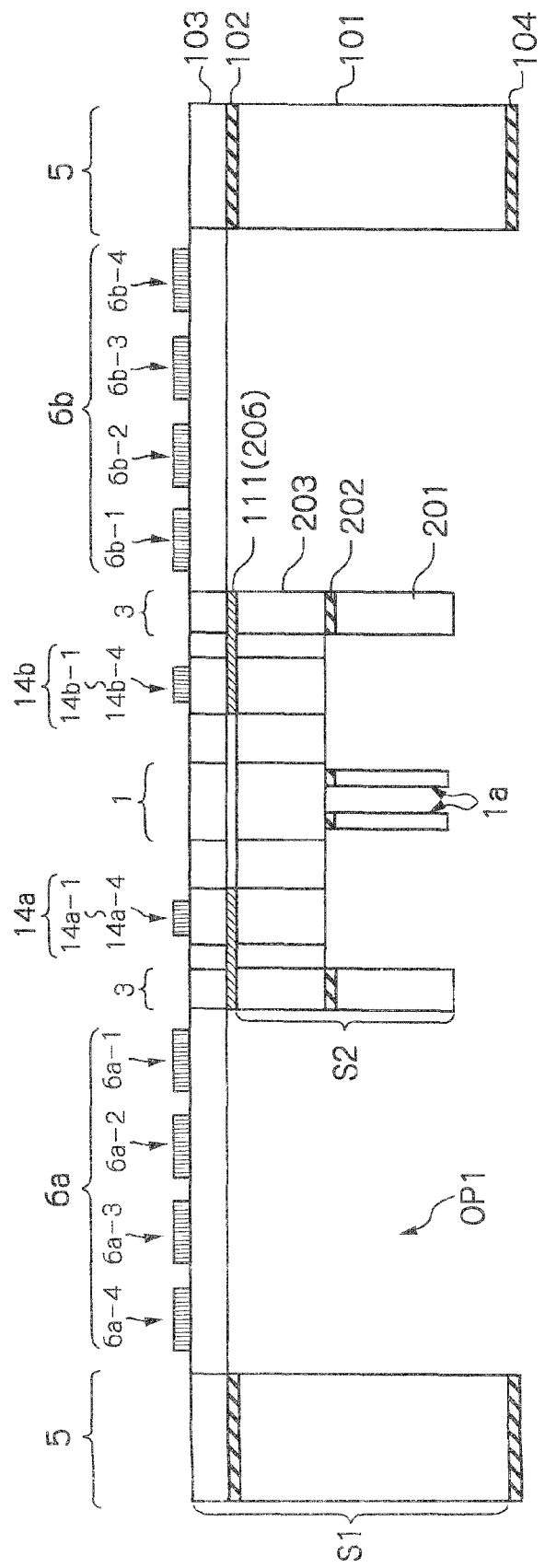
Figure 10C:
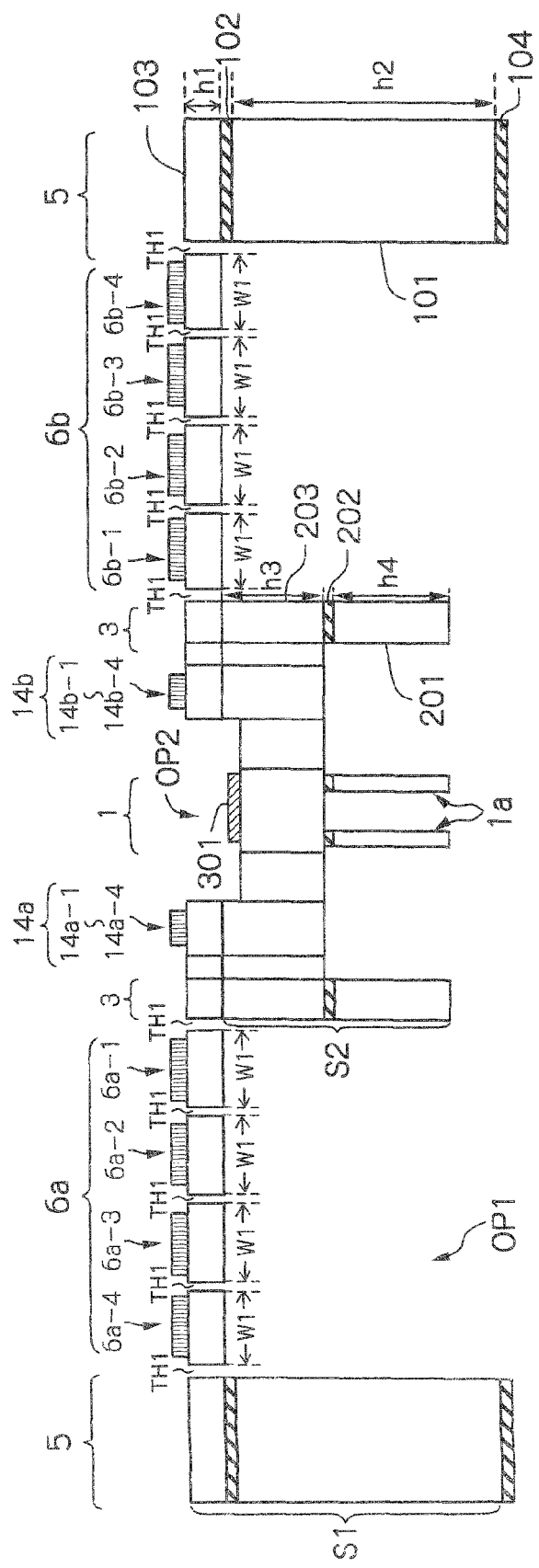

Steps of bonding the second SOI structure S2 to the first SOI structure S1 are illustrated in FIGS. 10A, 10B and 10C similar to FIGS. 3A, 3B and 3C.

In FIG. 10C, the height h1 of the active layer 103 and the height h2 of the support layer 101 in the first SOI structure S1, the height h3 of the active layer 203 and the height h4 of the support layer 201 in the second SOI structure S2, the width W1 of the piezoelectric cantilevers 6a-1, 6a-2, 6a-3, 6a-4, 6b-1, 6b-2, 6b-3 and 6b-4 and the width W2' (see: FIG.

9) of the piezoelectric cantilevers 14a-1, 14a-2, 14a-3, 14a-4, 14b-1, 14b-2, 14b-3 and 14b-4 are individually determined by the following:

$$h1 < h3 \quad (1)$$

$$h2 > h3 + h4 \quad (2)$$

$$W1 > 8 \cdot h1 \quad (3)$$

$$W2' < 2 \cdot h3 \quad (4)'$$

According to the formula (4)', the rigidities of the piezoelectric cantilevers 14a-1, 14a-2, 14a-3, 14a-4, 14b-1, 14b-2, 14b-3 and 14b-4 can be enhanced to avoid the pumping phenomenon of the mirror 1.

In the above-described embodiments, the length of each of the piezoelectric cantilevers 6a-1 and 6a-4 can be about half of that of each of the piezoelectric cantilevers 6a-2 and 6a-3. Similarly, the length of each of the piezoelectric cantilevers 6b-1 and 6b-4 can be about half of that of each of the piezoelectric cantilevers 6b-2 and 6b-3. Thus, the rocking axis of the mirror 1 can be brought close to the Y-axis.

In the above-described second embodiment, the length of each of the piezoelectric cantilevers 14a-1 and 14a-4 can be about half of that of each of the piezoelectric cantilevers 14a-2 and 14a-3. Similarly, the length of each of the piezoelectric cantilevers 14b-1 and 14b-4 can be about half of that of each of the piezoelectric cantilevers 14b-2 and 14b-3. Thus, the rocking axis of the mirror lean be brought close to the X-axis.

It will be apparent to those skilled in the art that various modifications and variations can be made in the presently disclosed subject matter without departing from the spirit or scope of the presently disclosed subject matter. Thus, it is intended that the presently disclosed subject matter covers the modifications and variations of the presently disclosed subject matter provided they come within the scope of the appended claims and their equivalents. All related or prior art references described above and in the Background section of the present specification are hereby incorporated in their entirety by reference.

The invention claimed is:

1. A two-dimensional optical deflector comprising:
a first SOI structure consisting of a first monocrystalline silicon support layer, a first monocrystalline silicon active layer and a first intermediate silicon dioxide layer sandwiched by said first monocrystalline silicon support layer and said first monocrystalline silicon active layer;
a second SOI structure consisting of a second monocrystalline silicon support layer, a second monocrystalline silicon active layer and a second intermediate silicon dioxide layer sandwiched by said second monocrystalline silicon support layer and said second monocrystalline silicon active layer, a height of said first monocrystalline silicon active layer being smaller than a height of said second monocrystalline silicon active layer;
a mirror;
an inner frame surrounding said mirror;
an inner piezoelectric actuator coupled between said mirror and said inner frame and adapted to rock said mirror around a first axis;
an outer frame surrounding said inner frame; and
an outer piezoelectric actuator coupled between said inner frame and said outer frame and adapted to rock said mirror around a second axis,
wherein said mirror includes said second monocrystalline silicon active layer without said first monocrystalline silicon active layer,
wherein said inner frame, said inner piezoelectric actuator and said outer frame include said first monocrystalline silicon active layer and said second monocrystalline silicon active layer, and
wherein said outer piezoelectric actuator includes said first monocrystalline silicon active layer without said second monocrystalline silicon active layer.

2. The two-dimensional optical deflector as set forth in claim 1, wherein said mirror and said inner frame further include said second monocrystalline silicon support layer and said second intermediate silicon dioxide layer,
wherein said outer frame further includes said first monocrystalline silicon support layer and said first intermediate silicon dioxide layer.

3. The two-dimensional optical deflector as set forth in claim 2, wherein a height of said first monocrystalline silicon support layer is larger than a total height of a height of said second monocrystalline silicon active layer and a height of said second monocrystalline silicon support layer.

4. The two-dimensional optical deflector as set forth in claim 1, further comprising a torsion bar coupled between said mirror and said inner frame along said first axis,
wherein said torsion bar includes said second monocrystalline silicon active layer without said first monocrystalline silicon active layer.

5. The two-dimensional optical deflector as set forth in claim 4, wherein a width of said torsion bar is smaller than twice a height of said second monocrystalline silicon active layer.

6. The two-dimensional optical deflector as set forth in claim 1, wherein said inner piezoelectric actuator is of a meander-type including a plurality of first piezoelectric cantilevers coupled in series and in parallel with said second axis.

7. The two-dimensional optical deflector as set forth in claim 6, wherein a width of each of said first piezoelectric cantilevers is smaller than twice a height of said second monocrystalline silicon active layer.

8. The two-dimensional optical deflector as set forth in claim 1, wherein said outer piezoelectric actuator is of a meander-type including a plurality of second piezoelectric cantilevers coupled in series and in parallel with said first axis.

9. The two-dimensional optical deflector as set forth in claim 8, wherein a width of each of said second piezoelectric cantilevers is larger than eight times a height of said first monocrystalline silicon active layer.

10. A method for manufacturing a two-dimensional optical deflector including: a mirror; an inner frame surrounding said mirror; an inner piezoelectric actuator coupled between said mirror and said inner frame and adapted to rock said mirror around a first axis; an outer frame surrounding said inner frame; and an outer piezoelectric actuator coupled between said inner frame and said outer frame and adapted to rock said mirror around a second axis, said method comprising:
preparing a first SOI structure consisting of a first monocrystalline silicon support layer, a first monocrystalline silicon active layer and a first intermediate silicon dioxide layer sandwiched by said first monocrystalline silicon support layer and said first monocrystalline silicon active layer;

preparing a second SOI structure consisting of a second monocrystalline silicon support layer, a second monocrystalline silicon active layer and a second intermediate silicon dioxide layer sandwiched by said second monocrystalline silicon support layer and said second monocrystalline silicon active layer, a height of said first monocrystalline silicon active layer being smaller than a height of said second monocrystalline silicon active layer;

forming an upper portion of said inner piezoelectric actuator and said outer piezoelectric actuator on said first monocrystalline silicon active layer;

perforating a first opening in said first monocrystalline silicon support layer except for said first monocrystalline silicon support layer of said outer frame, after said upper portion forming;

forming a lower portion of said mirror, said inner frame and said inner piezoelectric actuator in said second SOI structure;

bonding said second SOI structure to said first SOI structure at the first opening of said first monocrystalline silicon support layer;

perforating a second opening in said first monocrystalline silicon active layer for said mirror after said bonding; and forming a reflective metal layer on said second monocrystalline silicon active layer at said second opening for said mirror.

11. The method as set forth in claim 10, wherein a height of said first monocrystalline silicon support layer is larger than a total height of a height of said second monocrystalline silicon active layer and a height of said second monocrystalline silicon support layer.

12. The method as set forth in claim 10, wherein said two-dimensional optical deflector further includes a torsion bar coupled between said mirror and said inner frame along said first axis, wherein said torsion bar includes said second monocrystalline silicon active layer without said first monocrystalline silicon active layer, and wherein a width of said torsion bar is smaller than twice a height of said second monocrystalline silicon active layer.

13. The method as set forth in claim 10, wherein said inner piezoelectric actuator is of a meander-type including a plurality of first piezoelectric cantilevers coupled in series and in parallel with said second axis, and wherein a width of each of said first piezoelectric cantilevers is smaller than twice a height of said second monocrystalline silicon active layer.

14. The method as set forth in claim 10, wherein said outer piezoelectric actuator is of a meander-type including a plurality of second piezoelectric cantilevers coupled in series and in parallel with said first axis, and wherein a width of each of said second piezoelectric cantilevers is larger than eight times a height of said first monocrystalline silicon active layer.

\* \* \* \* \*